United States Patent [19]

Suzuki et al.

[11] Patent Number: 4,463,327

[45] Date of Patent: Jul. 31, 1984

[54] SURFACE ACOUSTIC WAVE DEVICE

[75] Inventors: Hitoshi Suzuki, Yokohama, Japan; Toshikazu Kodama, Stanford, Calif.

[73] Assignee: Tokyo Shibaura Denki Kabushiki Kaisha, Kanagawa, Japan

[21] Appl. No.: 405,435

[22] Filed: Aug. 5, 1982

[30] Foreign Application Priority Data

Sep. 9, 1981 [JP] Japan .................. 56-141054

[51] Int. Cl.$^3$ .................. H03H 9/25; H03H 9/64
[52] U.S. Cl. .................. 333/194; 333/196; 310/313 C
[58] Field of Search .................. 333/150–155, 333/193–196; 310/313 R, 313 A, 313 B, 313 C, 313 D

[56] References Cited

U.S. PATENT DOCUMENTS

| 3,663,899 | 5/1972 | Dieulesaint | 333/166 |
| 3,835,422 | 9/1974 | Hartemann | 333/196 |
| 3,868,608 | 2/1975 | Williams | 333/193 |
| 4,016,513 | 4/1977 | Solie | 333/154 |
| 4,066,985 | 1/1978 | Kuny | 333/194 |
| 4,090,153 | 5/1978 | Toda et al. | 333/151 |
| 4,144,508 | 3/1979 | Lewis et al. | 333/194 X |
| 4,203,082 | 5/1980 | Tsukamoto et al. | 333/194 |
| 4,206,380 | 6/1980 | Hazama et al. | 333/194 X |
| 4,298,849 | 11/1981 | Arneson | 333/193 |

FOREIGN PATENT DOCUMENTS 55-100721 of 0000 Japan.

OTHER PUBLICATIONS

Meyer, P. C., "Low Shape Factor Filter Design Considerations," 1975, *Ultrasonics Symposium Proceedings*, IEEE, Cat. No. 75, CHO 994-4SU, p. 334.

Japan Electrocommunication Society, "17 MHZ Bandwidth SAW VSB Filter," *Preliminary Report for the National Convention of the Electrocommunication Society in 1981*, p. 1–68.

Primary Examiner—Marvin L. Nussbaum
Attorney, Agent, or Firm—Banner, Birch, McKie & Beckett

[57] ABSTRACT

This Surface Acoustic Wave (SAW) filter has a tilted, interdigital transducer and a normal interdigital transducer separated from each other on a piezoelectric substrate. An input signal with a large bandwidth is applied to the tilted transducer, while an output signal is obtained from the normal transducer. Guaranteed attenuation can be greatly improved, and ripple in the pass band markedly reduced, by grounding one of the electrodes of the tilted transducer. This electrode is the one containing the longer of the two electrode fingers closest to the normal transducer.

7 Claims, 9 Drawing Figures

F I G. 5
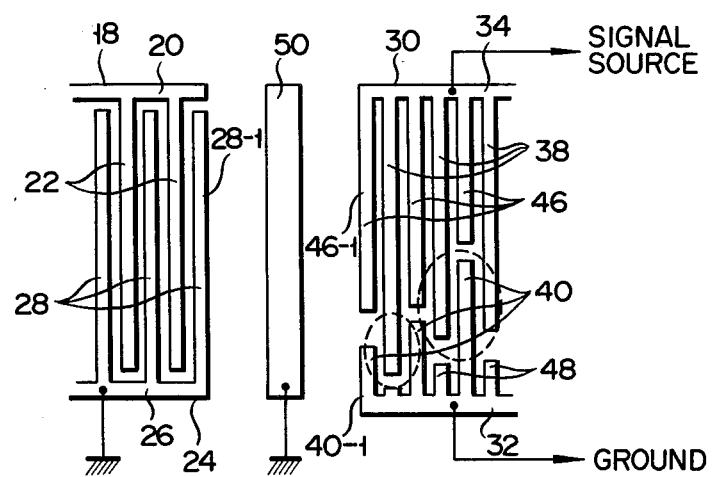
F I G. 6
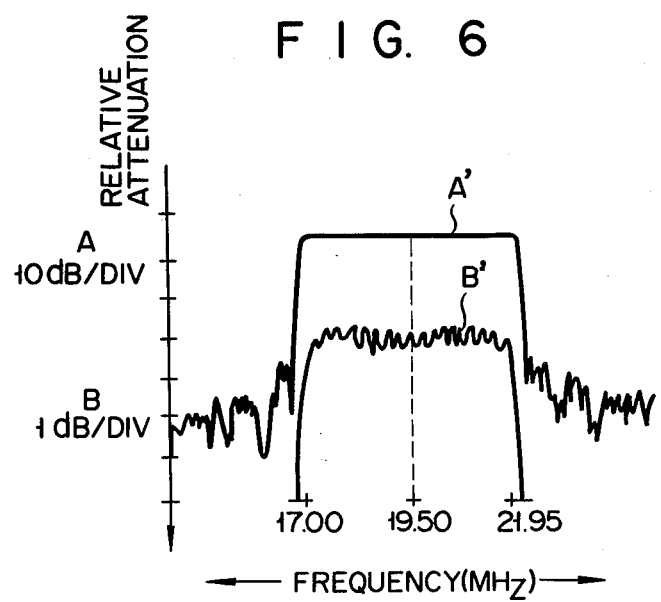

SURFACE ACOUSTIC WAVE DEVICE

BACKGROUND OF THE INVENTION

This invention relates to a surface acoustic wave device for filtering electrical signals, and in particular, to a surface acoustic wave device having a tilted transducer and a normal transducer.

Surface acoustic wave devices have been widely used as electronic filters. Various types of filters using surface acoustic wave devices (hereinafter called SAW filters) have already been proposed for diverse applications. Among them is a SAW filter which has a tilted transducer and a normal transducer as input and output transducers, proposed by the present inventors (see the preliminary report for the National Convention of the Electrocommunication Society in 1981, page 1-68, published by the Japan Electrocommunication Society). This SAW filter has been designed for use as a VSB (vestigial sideband) filter in television broadcasting transmitters where both a large relative bandwidth and a frequency-amplitude (transfer) characteristic of low "shape factor" are required. (Shape factor is defined as the ratio of the $-30$ dB bandwidth to the $-3$ dB bandwidth, 0 dB being measured at the center of the pass band.) The SAW filter with one normal and one tilted transducer is more compact than filters in which both the input and output transducers are tilted and coupled by a multistrip coupler. However, the conventional SAW filter using a combination of a tilted transducer and normal transducer has several deficiencies. First, it has a "guaranteed attenuation" (the difference in attenuation of signals between the pass band and the rejection band) of only 30 dB, which is insufficient. Second, it has an undesirably large amplitude ripple of $\pm 0.25$ dB in the pass band.

SUMMARY OF THE INVENTION

It is, therefore, an object of the invention to provide a SAW filter having a greater guaranteed attenuation and a smaller ripple in the pass band.

It is another object of the invention to provide a compact SAW filter suitable for use as a VSB filter.

According to the invention a tilted transducer and a normal transducer are spaced from each other on a piezoelectric substrate. The tilted transducer has first and second comb-like electrodes each having a common terminal and parallel electrode fingers connected to the common terminal. The fingers of the first and second electrodes are interdigitally overlapped to some extent with each other so that, in the areas of overlap, adjacent fingers are connected to opposite terminals or electrodes. An imaginary outline around the overlapped portions of the active electrode fingers (the pattern or envelope of the overlapped portions) forms a plurality of lobes including a main lobe and a plurality of side lobes aligned at an angle (tilted) from the direction of propagation of the surface acoustic wave and from the direction of the electrode fingers. The normal transducer also has first and second electrodes, each with a common terminal and parallel electrode fingers interdigitally overlapping with each other. The overlapped portions of the electrode fingers in this case, however, do not form lobes but are all of equal length (uniform overlapping). An input signal of large bandwidth is applied between the first and second tilted (input) electrodes, and an output signal is obtained from the normal transducer. In a tilted transducer, one of the two end electrode fingers, those nearest the output (normal) transducer, is longer. It has been found that grounding the electrode which contains this longer finger with result in an improvement in both the guaranteed attenuation and the pass-band ripple.

BRIEF DESCRIPTION OF THE DRAWINGS

FIG. 5 is an enlarged view of parts of the electrodes of the device of FIG. 4;

FIG. 6 shows the transfer characteristic of the device of FIG. 4; and

DESCRIPTION OF THE PREFERRED EMBODIMENT

Figure 1:
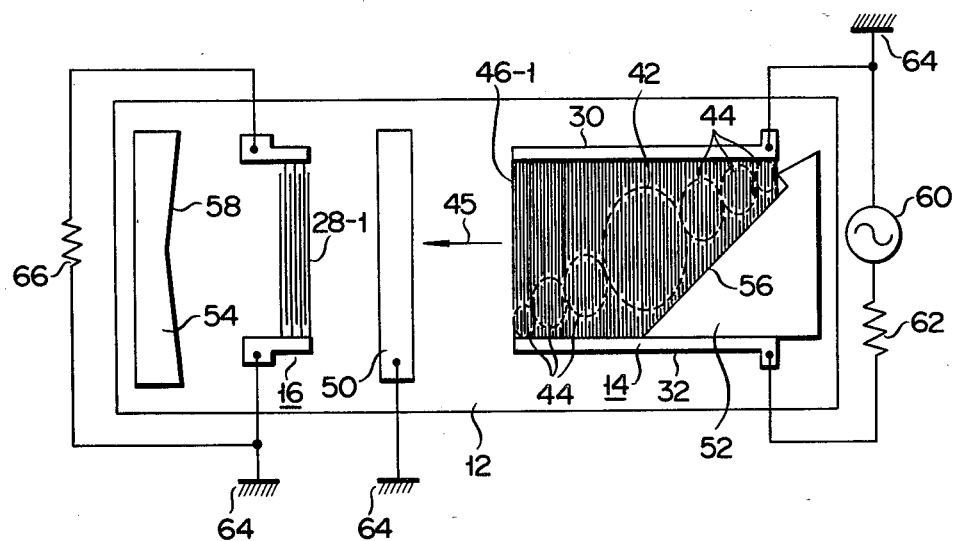
FIG. 1 is a top view of a SAW filter according to the invention.

In FIG. 1, a piezoelectric substrate 12 such as LiNbO$_3$ is shown on which a tilted input transducer 14 and a normal output transducer 16 are formed by known printed circuit manufacturing techniques. That is, aluminum is vapor-deposited, to a thickness of 0.2 to 1 um, on substrate 12, then required patterns are formed by photo-etching. Normal transducer 16 has a pair of comb-like electrodes 18 and 24 to form a so-called interdigital transducer. Specifically, the first electrode 18 has a common terminal 20 and a plurality of parallel active electrode fingers 22 and the second electrode 24 has a common terminal 26 and a plurality of parallel active electrode fingers 28 positioned in interdigital relationship with active electrode fingers 22. Pairs of adjacent active electrode fingers 22 and 28, connected to opposite terminals 20 and 26, are overlapped with each other along almost their full length, and the extent of overlap is uniform for all pairs of fingers. Tilted transducer 14 is also made up of first and second comb-like electrodes 30 and 32 having common terminals 34 and 36 and parallel active electrode fingers 38 and 40 positioned in interdigital relationship with each other. The extent of overlap of opposite active electrode fingers 38 and 40 is, however, not uniform. These are designed, as is well known to those skilled in the art, to correspond to the wave form of the impulse response of the filter which is being designed, so that an imaginary outline around these overlapped active electrode fingers (the pattern or envelope of the overlapped portion) forms a main lobe 42 in the middle of tilted electrode 14 and a plurality of side lobes 44 on both sides of the main lobe. Side lobes 44 are aligned at an angle to the direction of propagation (shown by an arrow 45 in FIG. 1) of the surface wave, which direction is perpendicular to the electrode fingers. The alignment of the lobes is, therefore, also at an angle to the direction of the electrode fingers. As is known in the art, tilting the electrode in this way prevents phase distortion and re-excitation of the surface waves, which degrade the filter characteristics. Some of the fingers 46 and 48 of the first and second electrodes 30 and 32 are dummy electrode fingers as is also well known. Dummy electrode fingers 46 are positioned between active electrode fingers 38, and dummy electrode fingers 48 between active fingers 40, to provide uniformity along the path of the surface acoustic wave. The dummy fingers do not themselves generate acoustic waves and hence do not overlap the fingers on the opposite side. A shield electrode 50 is formed on the substrate between tilted input transducer 14 and normal output transducer 16. This shield electrode prevents unwanted electrical coupling between titled transducer 14 and normal transducer 16 which would otherwise occur when they are placed close to each other in order to make the SAW filter compact. At the ends of substrate 12 are absorbers 52 and 54 made from an adhesive such as an epoxy bonding agent or an ink used for screen printing or the like. These absorbers eliminate unwanted reflections of the surface waves from both ends of substrate 12 by absorbing waves which reach them. Inner edges 56 and 58 of absorbers 52 or 54 are tilted to divert the surface waves, reflected from the edges of the absorbers themselves, away from the direction of propagation of the surface wave.

Radio-frequency signals, such as television signals with a central frequency of about 19.5 MHz, for example, are transmitted from the signal source through a series resistor 62 to common terminals 34 and 36 of tilted transducer 14. Common terminal 34, part of the first electrode 30, is connected to ground 64. The reason for this will be explained later. Common terminals 20 and 24 of the normal transducer 16 are connected to a load 66 representing such equipment as a broadcasting antenna. One of these common terminals (in this case 24) is also connected to ground 6, as is shield electrode 50.

Figure 3:
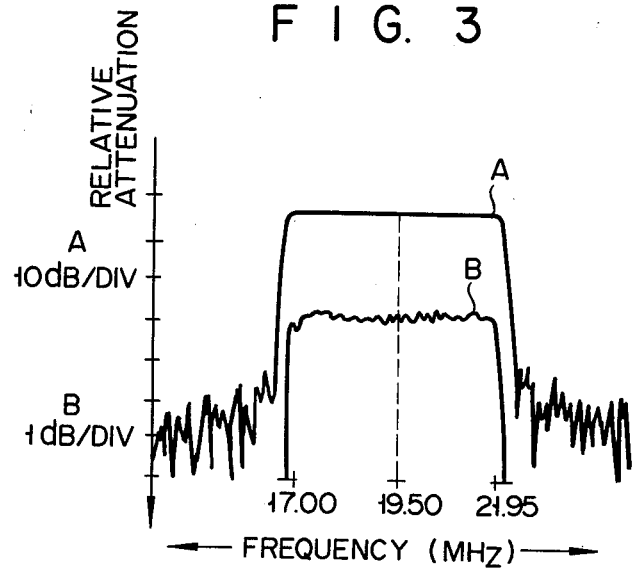
FIG. 3 shows the transfer characteristic of the device of FIG. 1.

FIG. 3 shows the transfer characteristic of the SAW filter made according to the invention. In the figure, frequency is shown on the horizontal axis, and relative attenuation (relative to the attenuation at the center of the pass band) is shown on the vertical axis at two different scales. Curve A shows the whole transfer characteristic at 10 dB/division and curve B shows a magnified diagram of the flat portion of the curve A, with the relative attenuation on a 1 dB/division scale. Curves A and B clearly show that the guaranteed attenuation has a value of about 40 dB and that the amplitude ripple in the pass band is within ±0.1 dB. These numerical values are considerably better than the values for conventional SAW filters given above.

Figure 2:
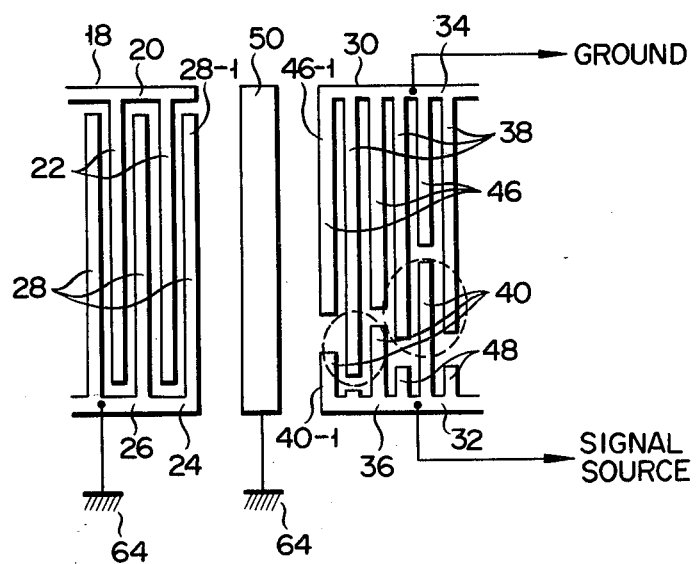
FIG. 2 is an enlarged view of parts of the electrodes of the device of FIG. 1.
Figure 4:
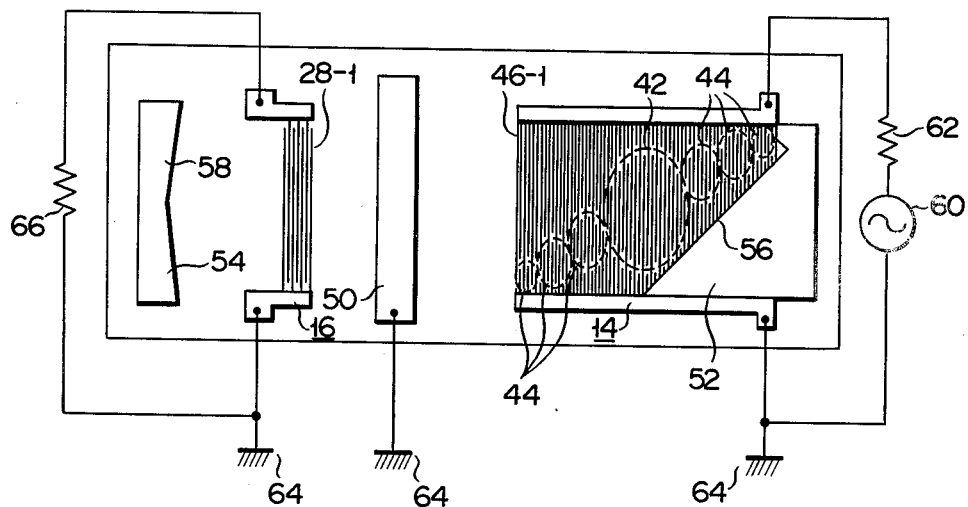
FIG. 4 is a top view of a modified SAW filter used for illustration purposes in a comparison test with the SAW filter of the present invention.

To prove the advantage of the present invention over conventional SAW filters of this kind, the inventors have made the following comparison. FIGS. 4 and 5 show a SAW filter provided for the comparison. The filter shown in FIGS. 4 and 5 has almost the same structure as the filter of FIG. 1 except that the second common terminal 36 instead of the first 34 is connected to ground 64. Therefore, the same reference numbers as those of FIGS. 1 and 2 are used. FIG. 6 is a graph showing the transfer characteristic of the filter of FIG. 4. It can there be seen that the guaranteed attenuation is as low as 30 dB and the amplitude ripple in the pass band is as high as ±0.25 dB. As is well known to those skilled in the art, the pass band is the frequency channel in which the filter should transmit signals (e.g., 17.00 to 21.95 MHz), while in the rejection band, signals should be absorbed (e.g., below 17.00 MHz and about 21.95 MHz).

A comparison of the rejection bands in FIGS. 3 and 6 shows that curve A' in FIG. 6 rises from a higher starting point than curve A in FIG. 3. This rise in that frequency range where there should be no surface wave generated (where all signals should be absorbed) is believed to be due to the bulk wave (an acoustic wave through the bulk of the material rather than on the surface); and in the case of FIG. 6, the bulk wave is stronger. This fact is also evident from a comparison of the amplitudes in the pass bands. The influence of the bulk wave on the characteristic is manifested as an amplitude ripple.

The inventors have performed an experiment to find out whether a bulk wave is in fact generated and where it originates, in the SAW filter shown in FIGS. 4 and 5. In this experiment, the impulse response to the filter shown in FIG. 4 was measured by an oscilloscope. It was observed that the wave form corresponding to the bulk wave appeared earlier than the pulse response curve on the oscilloscope. Since the material which composes the substrate is known, the rate of propagation of the bulk wave is known and hence it is possible to calculate the point or origin of the bulk wave from its detection time. According to the inventors' calculations, the point of origin of the bulk wave is clearly the dummy electrode finger 46-1 of FIG. 5 which is closest to shield electrode 50 or normal transducer 16. From this evidence, it was deduced that the bulk waves are generated by coupling, via the interior of substrate 12, between dummy electrode finger 46-1 upon which the input signal from source 60 is impressed, and active electrode finger 28-1 of normal transducer 16 which is closest to tilted transducer 14.

On the contrary, as shown in FIG. 2, in the SAW filter according to the invention, the signal is supplied to a different electrode 32. Active electrode finger 40-1, which is one of the two fingers closest to normal transducer 16 and which is supplied with the input signal, is shorter than the opposite corresponding dummy electrode finger 46-1, which is grounded. The level of bulk wave generated by active electrode finger 40-1 is much lower than that generated by dummy electrode finger 46-1 since dummy electrode finger 46-1 is much longer than its opposite active finger 40-1. As a result of the experiment, it was also learned that, with respect to normal transducer 16, it is preferable to ground electrode 26 having the closest electrode finger 28-1 to tilted input transducer 14. However, the experiment showed that even if the opposite electrode 18 is grounded instead of electrode 26, substantially the same effect is obtained.

Figure 7:
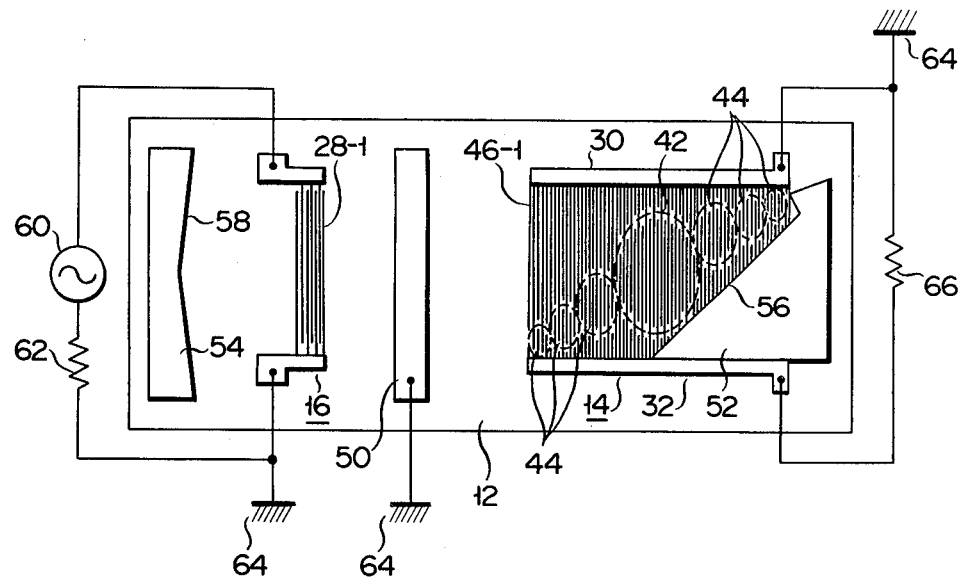
FIGS. 7-9 are top views of other embodiments of the present invention.

FIG. 7 shows another embodiment of the invention in which the input and output electrodes are reversed. That is, signal source 60 and resistor 62 are connected to normal transducer 16, and load resistor 66 is connected to tilted transducer 14. In this embodiment, electrode 30 of tilted transducer 14 and electrode 24 of normal transducer 16 are grounded. Since other parts of this embodiment are the same as that shown in FIG. 1, further explanation of the operation of this emobidment is unnecessary.

Figure 8:
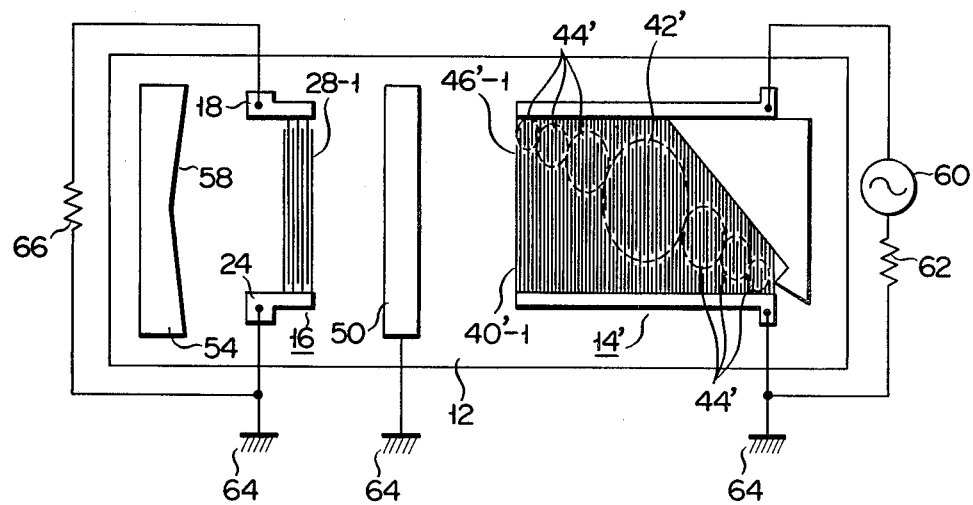

FIG. 8 also shows an embodiment of the invention; in this case, the tilted transducer 14 is replaced by a modified tilted transducer 14' in which side lobes 44' are tilted (relative to main lobe 42') in a different direction. Dummy electrode finger 40'-1, which is closest to normal transducer 16 and longer than its opposite active electrode finger 46'-1, is connected to ground. Here again, further explanation is unnecessary since the remaining parts of the embodiment are the same as those of FIG. 1.

Figure 9:
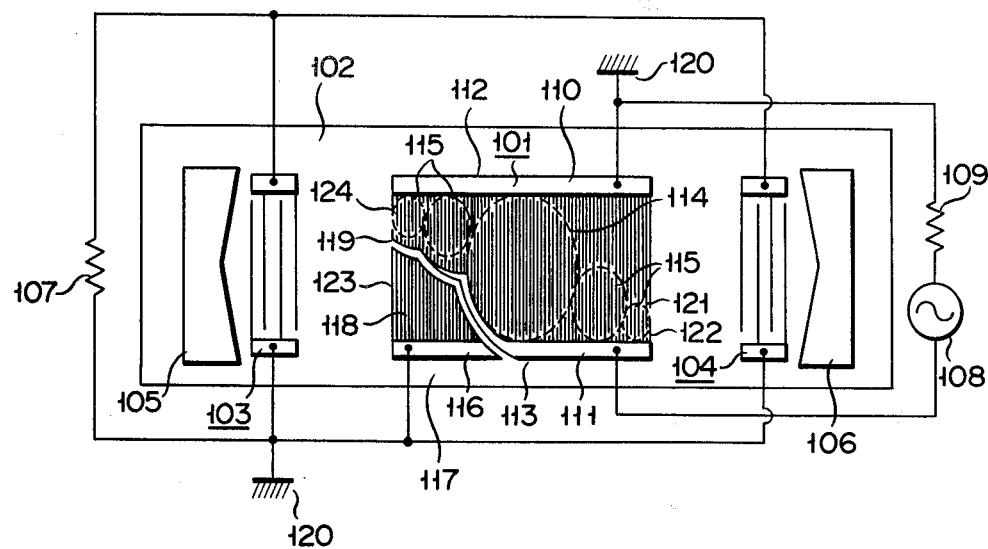

FIG. 9 shows still another embodiment of the invention in which tilted input transducer 101 is centered on substrate 102 and first and second normal output transducers 103 and 104 are on either side of the tilted transducer. At the ends of substrate 102 are absorbers 105 and 106. Load 107 is connected to the output terminals of both the first and second normal transducers. An input signal from signal source 108 is supplied via resistor 109 to the opposite common terminals 110 and 111 of first and second electrodes 112 and 113 respectively. Common terminal 111 of second electrode 113 has a curved branch 119 which outlines main lobe 114 and several side lobes 115. A separate dummy electrode 116 having a common terminal 117 and dummy electrode fingers 118 parallel to those of the first and second electrodes is shaped to follow the curved branch 119 of second electrode 113. The common terminal 117 of this separate dummy electrode 116 is connected to ground 120, as are one of the terminals of each normal electrode 103 and 104. A dummy electrode finger 121, which is closest to the second normal transducer 104 and longer than its opposite active electrode finger 122, is connected to the ground 120 through its common terminal 110. Another dummy electrode finger 123, which is closest to first normal transducer 103 and longer than its opposite electrode finger 124, is also connected to the ground 120. In this embodiment, a bulk wave is effectively avoided between input tilted transducer 101 and each normal transducer 103 and 104 since electrode fingers 121 and 123, which are closest to their respective normal transducers, are grounded.

Although illustrative embodiments of the invention have been described in detail with reference to the accompanying drawings, it is to be understood that the invention is not limited to those precise embodiments and that various changes and modifications may be effected therein by one skilled in the art without departing from the scope or spirit of the invention.

We claim:
1. A surface acoustic wave device comprising:
a piezoelectric substrate;
a first interdigital transducer on said substrate, said first interdigital transducer comprising:
 (i) a first electrode having a common terminal joining a plurality of parallel electrode fingers; and
 (ii) a second electrode having a common terminal joining a plurality of parallel electrode fingers uniformly overlapped with said electrode fingers of said first electrode;
a second interdigital transducer spaced from said first transducer on said substrate in a direction of propagation, said second transducer comprising:
 (i) a first electrode having a plurality of parallel electrode fingers including a first end finger nearest said first transducer; and
 (ii) a second electrode having a plurality of parallel electrode fingers interdigitally overlapped with said electrode fingers of said first electrode, including a second end finger nearest said first transducer, the pattern of overlapping forming a main lobe and a plurallity of side lobes aligned at an angle to said electrode fingers and to the direction of propagation, one of said end fingers being a longer one; and
ground means for connecting to ground the one of said electrodes which includes the longer one of said first and second end fingers.

2. A surface acoustic wave device as claimed in claim 1 wherein said electrode fingers of said first and second electrodes include active electrode fingers and dummy electrode fingers.

3. A surface acoustic wave device as claimed in claim 2 wherein said first transducer functions as an output transducer and said second transducer functions as an input transducer.

4. A surface acoustic wave device as claimed in claim 2 further comprising a shield electrode on said substrate between said first transducer and said second transducer to prevent electrical coupling between said transducers.

5. A surface acoustic wave device as claimed in claim 4 further comprising absorbing means on said substrate for absorbing acoustic waves reflected from the ends of said substrate.

6. A surface acoustic wave band pass filter comprising:
a piezoelectric substrate;
a first interdigital transducer on said substrate, said first transducer comprising:
 (i) a first electrode having a common terminal joining a plurality of parallel electrode fingers;
 (ii) a second electrode having a common terminal joining a plurality of parallel electrode fingers uniformly overlapped with said electrode fingers of said first electrode;
a second interdigital transducer spaced from said first transducer on said substrate in a direction of propagation, said second transducer comprising:
 (i) a first electrode having a plurality of parallel electrode fingers including a first end finger nearest said first transducer;
 (ii) a second electrode having a plurality of parallel electrode fingers interdigitally overlapped with said electrode fingers of said first electrode, including a second end finger nearest said first transducer, the pattern of overlapping forming a main lobe and a plurality of side lobes aligned at an angle to said electrode fingers and to the direction of porpagation, one of said end fingers being longer and the other being shorter; and
input means for connecting to a signal source the one of said electrodes which includes the shorter one of said first and second end fingers and for connecting to ground the one of said electrodes which includes the longer one of said first and second end fingers.

7. In a surface acoustic wave device for selectively attenuating signals in a rejection band to a greater degree than signals in a pass band, said surface acoustic wave device comprising:
a piezoelectric substrate;
a first interdigital transducer on said substrate, said first interdigital transducer comprising (i) a first electrode having a common terminal joining a plurality of parallel electrode fingers, and (ii) a second electrode having a common terminal joining a plurality of parallel electrode fingers uniformly overlapped with said electrode fingers of said first electrode;
a second interdigital transducer spaced from said first transducer on said substrate in a direction of propagation, said second transducer comprising (i) a first electrode having a plurality of parallel electrode fingers including a first end finger nearest said first transducer, and (ii) a second electrode having a plurality of parallel electrode fingers including a second end finger nearest said first transducer, one of said end fingers being a longer one, a method of increasing the difference in attenuation of signals between the rejection band and the pass band and decreasing the pass band amplitude ripple of said device, said method comprising the step of grounding the one of said electrodes which includes the longer one of said first and second end fingers.

* * * * *